United States Patent
Winkens (10) Patent No.: US 12,379,404 B2
(45) Date of Patent: Aug. 5, 2025

(54) CIRCUIT ARRANGEMENT FOR MEASURING AT LEAST ONE CAPACITOR

(71) Applicant: Balluff GmbH, Ludwigshafen (DE)

(72) Inventor: Frank Winkens, Ludwigshafen (DE)

(73) Assignee: BALLUFF GMBH, Neuhausen ADF (DE)

(*) Notice: Subject to any disclaimer, the term of this patent is extended or adjusted under 35 U.S.C. 154(b) by 156 days.

(21) Appl. No.: 18/513,897

(22) Filed: Nov. 20, 2023

(65) Prior Publication Data

US 2024/0168070 A1     May 23, 2024

(30) Foreign Application Priority Data

Nov. 23, 2022 (DE) .......... 10 2022 131 053

(51) Int. Cl.
    *G01R 27/26*     (2006.01)
    *G01D 5/24*     (2006.01)
    (Continued)

(52) U.S. Cl.
    CPC .......... *G01R 27/2605* (2013.01); *G01D 5/24* (2013.01); *G01N 27/228* (2013.01); *H03K 17/955* (2013.01)

(58) Field of Classification Search
    CPC ........ G01R 27/00; G01R 27/02; G01R 27/26; G01R 27/2605; G01N 27/00; G01N 27/02;
(Continued)

(56) References Cited

FOREIGN PATENT DOCUMENTS

BE     1007258 A3 *    5/1995  ............. G01R 27/26
DE     1673841 A1     6/1971
(Continued)

*Primary Examiner* — Hoai-An D. Nguyen
(74) *Attorney, Agent, or Firm* — GableGotwals (57) ABSTRACT

Circuit arrangement measuring at least one measurement capacitor having inverting amplifier with high open-circuit voltage gain, input connected to connection of at least one measurement capacitor and to connection of negative feedback capacitor, another connection of at least one measurement capacitor connected to a reference potential and another connection of negative feedback capacitor connected to output of inverting amplifier; rectifier circuit fed voltage at the output of inverting amplifier and generates at its output voltage corresponding to voltage at output of inverting amplifier; a holding capacitor buffering voltage supply of inverting amplifier and rectifier circuit, a supply voltage connection of inverting amplifier supplied with a periodic control voltage with respect to reference potential and other supply voltage connection of inverting amplifier supplied via a diode with external supply voltage, periodic control voltage generated by signal source having a control input via which level of periodic control voltage can be infinitely variably set and this control input connected to an output of a control device which compares voltage generated at output of rectifier circuit with a desired voltage and, depending on comparison, emits output signal fed to control input of signal source, until level of periodic control voltage fed to supply voltage connection of inverting amplifier reaches value at voltage generated at output of rectifier circuit matches desired voltage, if voltage present at output of rectifier circuit matches desired voltage, at least voltage present at output of control device is a measure for at least one measurement capacitor.

10 Claims, 6 Drawing Sheets

(51) Int. Cl.
*G01N 27/22* (2006.01)
*H03K 17/955* (2006.01)

(58) Field of Classification Search
CPC ........ G01N 27/22; G01N 27/228; G01D 5/00;
G01D 5/12; G01D 5/14; G01D 5/24;
H03F 1/00; H03F 2200/00; H03F
2200/129; H03F 2200/228; H03K 17/00;
H03K 17/94; H03K 17/945; H03K
17/955; H03K 2217/00; H03K 2217/94;
H03K 2217/96; H03K 2217/9607; H03K
2217/960755; H03K 2217/960765
USPC .......................................... 324/600, 649, 658
See application file for complete search history.

(56) References Cited

FOREIGN PATENT DOCUMENTS

| | | |
|---|---|---|
| DE | 19701899 A1 | 10/1997 |
| DE | 19945330 A1 | 4/2001 |
| DE | 10156580 B4 | 5/2003 |
| DE | 102009017011 A1 | 10/2010 |
| DE | 102013201704 A1 | 8/2014 |
| JP | H10274586 A * 10/1998 | ............. G01R 27/26 |

\* cited by examiner

CIRCUIT ARRANGEMENT FOR MEASURING AT LEAST ONE CAPACITOR

CROSS-REFERENCE TO RELATED APPLICATIONS

This United States application claims priority to German Patent Application No. DE 10 2022 131 053.1 filed 23 Nov. 2022, which is incorporated herein by reference.

The invention relates to a circuit arrangement for measuring at least one capacitor.

Figure 1:
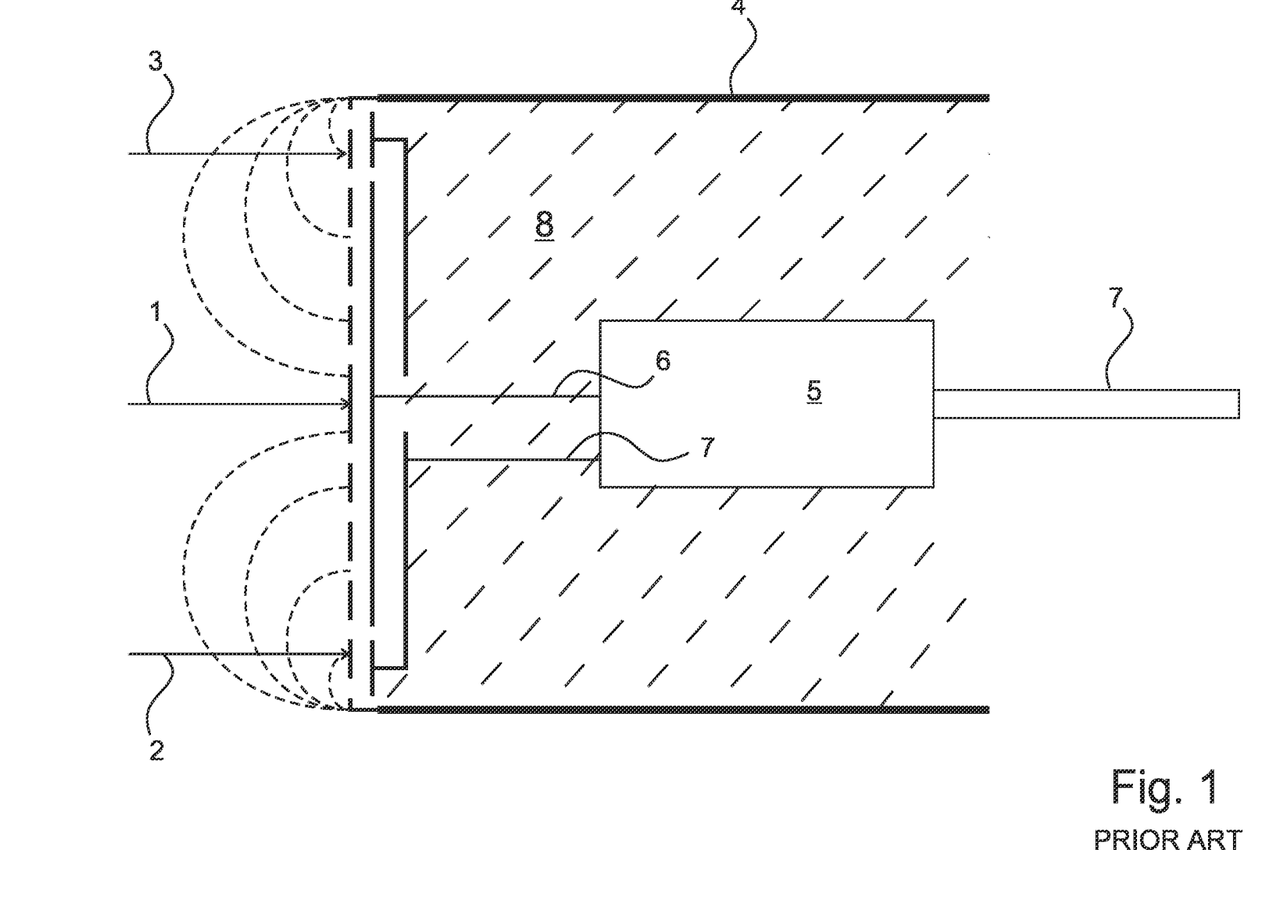
FIG. 1 schematically shows a structure of a flush capacitive sensor known from the prior art.

Such a circuit arrangement may be used, for example, in capacitive sensors. Capacitive sensors for detecting objects of different materials and shapes and levels of granular, pulverulent or liquid media or for machine tool distance measuring work according to the principle of a plate capacitor. The capacitance thereof depends on the plate surface, the plate distance and a dielectric located between the plates. Objects and media with higher densities than air in the detection area between the plates lead to an increase in the capacitance which is evaluated by the sensor. For practical reasons, the plates are not positioned opposite one another in capacitive sensors, but are instead arranged in a plane. FIG. 1 schematically shows a structure known per se of such a sensor. Here, the first plate 1 is the active electrode to be measured, and the second plate or counter-electrode 4 may, for example, be a metal housing of the sensor connected to a ground reference. FIG. 1 schematically shows the field line course between the first plate 1 and the counter-electrode 4. It is the capacitance between the first plate 1 and the ground reference that is measured here. The particular challenge now lies in the extraordinarily low measurement capacitance and its change through objects or filling levels. Depending on the application and construction size, the measurement range lies between 20 fF and 3,000 fF, in particular 20 fF to 100 fF.

The first electrode 1 is sensitive on both sides, that is to say also in respect of the non-detection area towards the sensor interior. There is therefore a high parasitic basic capacitance at the first electrode 1 even without any object or any medium in the detection area through the proximity to the housing 4, through the protective cap 3 and through casting compounds 8 contained, for example, in the sensor. This basic capacitance is many times higher than the capacitance to be measured. In order to take this fact into account, provision is made for a shield electrode or field bundle electrode 2 which surrounds the first electrode 1 in the sensor interior in a cup-shape. Since the shielding capacitor between the first electrode 1 and the field bundle electrode 2 usually takes the form of a shield layer on a printed circuit board, especially in flat devices, this is several pF and therefore cannot easily be connected to the ground reference. It has to be controlled at low impedance by a suitable signal 7 which is provided by an electronic circuit 5 so that it differs as little as possible in relation to the phase and amplitude of the potential at the first electrode 1 or at the input 6 of the electronic circuit 5. This is achieved, for example, through non-inverting voltage followers or buffer amplifiers with high input impedance, low input capacitance and low impedance output. Other methods use the shielding capacitor as an integral part in the form of a capacitive voltage divider between the capacitance to be measured of the first electrode 1 with respect to earth and the capacitance of the first electrode 1 with respect to the capacitance of the shield electrode 2. A fundamental challenge is presented here by parasitic semiconductor capacitances at the measurement input 6 of the electronic circuit 5 which are likewise in orders of magnitude above the capacitance to be measured. These factors limit the performance and the detection area or switching distance through the temperature, the EMC and further industry requirements.

DE 10 2013 201 704 A1 discloses a capacitive sensor arrangement or a capacitive measurement method with compensation for parasitic capacitances which works as a low-frequency oscillator through periodic charging and discharging of a measurement capacitor through a high resistance. The vibration frequency of this low-frequency oscillator is evaluated as a measure for the measurement capacitor. Parasitic input capacitances are to be compensated for by a buffer amplifier with an adjusted voltage amplification factor of more than 1.

DE 197 01 899 A1 discloses a circuit arrangement for detecting the capacitance or a change of capacitance of a capacitive circuit element or component, in which the necessary amount of charge is evaluated through permanent discharging and charging of a measurement capacitor via electronic toggle switches. The parasitic input capacitances are to be compensated for by evaluating the difference compared to a second branch structured in the same way. Using this circuit arrangement, no shield signal imperative for flush sensors can be provided.

A device for showing the existence, the approach or the enlargement of solid bodies, liquids or gases in which a measurement capacitor determines the vibration condition of an oscillator or feedback amplifier in the negative feedback branch is known from DE 1 673 841 A1. Small changes in the measurement capacitor are evaluated using the vibration amplitude.

DE 101 56 580 B4 discloses oscillating circuits for detecting small capacitances or differences in capacitance for use in capacitive sensors. In this oscillating circuit, the vibration behaviour of an oscillator is evaluated as a measure for the measurement capacitor.

A method for detecting and evaluating small capacitance changes for use in switch signal and a capacitive sensor for this purpose are disclosed in DE 199 45 330 A1. In this method and the circuit arrangement, an arrangement consisting of an amplifier with constant supply voltage with a measuring electrode at the input and a rectifier circuit at the output fluctuates with respect to the ground reference with a rectangular voltage of constant, high amplitude. The signal caused by the measurement capacitor compared to ground reference is amplified, rectified and output as DC voltage as a measure for the measurement capacitor compared to ground reference.

DE 10 2009 017 011 A1 discloses a circuit arrangement for determining a measurement capacitor in which the measurement capacitor is from time to time suddenly discharged to zero through an electronic on-off switch and, when the switch is on, charged via a resistor. The average value of the charge characteristic obtained via an RC lowpass filter corresponds to the measurement capacitor. The parasitic input capacitances are compensated for by evaluating the difference compared to a second branch structured in the same way. A shield signal imperative for flush sensors is not available.

The object of the invention is to provide a circuit arrangement for measuring at least one measurement capacitor which minimises the influence of the parasitic semiconductor capacitances described at the outset, provides a shield signal for a shield electrode and enables very small measurement capacitors to be detected at little expense and therefore greater detection areas, switching distances and, in addition, also more stable circuit arrangements.

This object is solved by an inverting amplifier with high open-circuit voltage gain, the input of which is connected to a connection of the at least one measurement capacitor and to a connection of a negative feedback capacitor, wherein the other connection of the at least one measurement capacitor is connected to a reference potential and the other connection of the negative feedback capacitor is connected to an output of the inverting amplifier, by a rectifier circuit which is fed the voltage at the output of the inverting amplifier and which generates at its output a voltage corresponding to the voltage at the output of the inverting amplifier and by a holding capacitor for buffering the voltage supply of the inverting amplifier and the rectifier circuit, wherein a supply voltage connection of the inverting amplifier is supplied with a periodic control voltage with respect to the reference potential and the other supply voltage connection of the inverting amplifier is supplied via a diode with an external supply voltage, wherein the periodic control voltage is generated by a signal source which has a control input via which the level of the periodic control voltage can be infinitely variably set and wherein this control input is connected to an output of a control device which compares the voltage generated at the output of the rectifier circuit with a desired voltage and, depending on the comparison, emits an output signal fed to the control input of the signal source, until the level of the periodic control voltage which is fed to the supply voltage connection of the inverting amplifier reaches a value at which the voltage generated at the output of the rectifier circuit matches the desired voltage and wherein, if the voltage present at the output of the rectifier circuit matches the desired voltage, at least the voltage present at the output of the control device is a measure for the at least one measurement capacitor.

The object is also solved by a circuit arrangement for measuring at least one measurement capacitor, by an inverting amplifier with a high open-circuit voltage gain, the input of which is connected to a connection of the at least one measurement capacitor (11) and to a connection of a negative feedback capacitor, wherein the other connection of the negative feedback capacitor is connected to an output of the inverting amplifier, and by a rectifier circuit which is fed the voltage at the output of the inverting amplifier and which generates at its output a voltage corresponding to the voltage at the output of the inverting amplifier, wherein a supply voltage connection of the inverting amplifier is connected to the reference potential and the other supply voltage connection of the inverting amplifier is connected to an external supply voltage, wherein a periodic control voltage is generated by a signal source, the control input of which is connected to an output of a control device which compares the voltage generated at the output of the rectifier circuit with a desired voltage and, depending on the comparison, emits an output signal fed to the control input of the signal source, depending on which, in the signal source, the level of the periodic control voltage which is fed to the other connection of the at least one measurement capacitor is varied until the voltage generated at the output of the rectifier circuit matches the desired voltage and wherein, if the voltage present at the output of the rectifier circuit matches the desired voltage, at least the voltage present at the output of the control device is a measure for the at least one measurement capacitor.

A key aspect of the solution according to the invention is an inverting amplifier with a highest possible open-circuit voltage gain of more than 100, the output of which is fed back or negatively fed back to the input via a fixed capacitor. Such an amplifier is very easy to produce with a two-stage transistor circuit or a standard operation amplifier. A connection of the capacitor to be measured is connected to the input of the amplifier. Present at the other connection of the capacitor to be measured is a periodic control voltage of, for example, sinusoidal or preferably rectangular curve shape. Without the negative feedback through the negative feedback capacitor, the output of the amplifier would jump to its negative positioning limit with respect to ground at the positive half-wave of the periodic control voltage and to its positive positioning limit with respect to the supply voltage in the negative half-wave of the periodic control voltage. However, through the negative feedback via the negative feedback capacitor, the amplifier can compensate for the voltage shift through the periodic control voltage at its input. The amplifier attempts, as it were, to keep the voltage change at its input to zero or at a static working point potential. The relationship between the actual variables can be derived by evaluating the resulting alternating currents. The output voltage now only depends on the periodic control voltage and the relationship between the capacitor to be measured and the feedback capacitor and therefore, for a given periodic control voltage and a given feedback capacitor, directly on the capacitor to be measured:

$$Ua = -Us \times Cm/Cfix$$

Where:
Ua=Output voltage
Us=Periodic control voltage
Cfix=Negative feedback capacitor
Cm=Capacitor to be measured There are no further influencing variables to be taken into consideration in the equation. As a result, very small capacitances can also be detected very precisely and robustly if Cfix and Us are suitably selected.

Through the amplifier's efforts to keep the dynamic input voltage at zero potential, there is virtually zero potential between the input of the amplifier V and its ground reference.

This is of fundamental importance because, as a result, the input impedance of the amplifier exercises no influence on the measurement result across a wide range since there are no alternating components present at it. The input capacitances interfering with measurement circuits in the prior art are neutralised by the virtual zero potential in the subject matter according to the invention.

This also means that a shielding capacitor can easily be connected between the input of the amplifier and its ground reference. No additional control signals and buffer amplifiers are necessary.

Advantageous configurations are the subject of the dependent claims referring back to claim 1 or 2. For example, provision is made for the inverting amplifier, the negative feedback capacitor, the rectifier circuit and the holding capacitor to form a circuit part which as a whole fluctuates with the periodic control voltage with respect to the reference potential.

According to one aspect of the invention, provision is made for a voltage supply of the circuit part to take place, in a positive/negative half-wave of the periodic control voltage, with a blocked diode through the holding capacitor and, in a negative/positive half-wave of the periodic control voltage, with a continuous diode under recharging of the holding capacitor through the external supply voltage/with respect to the reference potential.

The periodic control voltage is preferably of rectangular shape. According to one aspect of the invention, instead of the control device, provision may be made for a DC voltage actuator, the output of which is fed to the control input of the signal source, wherein at least the voltage present at the output of the rectifier circuit is a measure for the at least one measurement capacitor.

According to one aspect of the invention, provision may also be made for the at least one measurement capacitor to be formed by an active measuring electrode and at least one shield electrode or field bundle electrode surrounding the active measuring electrode in a cup-shape, wherein the shield electrode or field bundle electrode is supplied with the periodic control voltage and wherein a capacitor is measured with respect to the reference potential.

DESCRIPTION OF THE DRAWINGS

Figure 2:
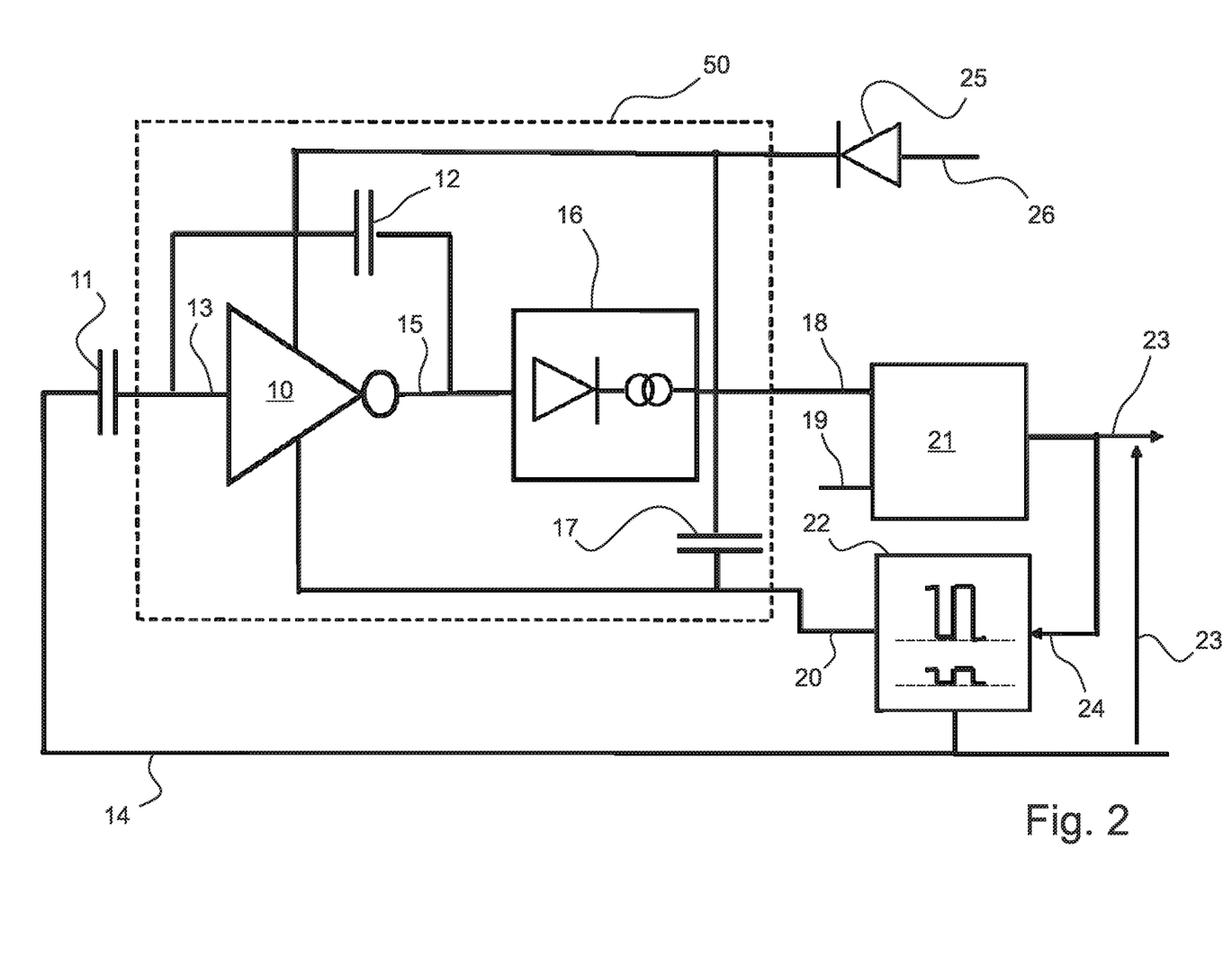
FIG. 2 shows a configuration of the circuit arrangement according to the invention for measuring at least one measurement capacitor.

A structure known per se of a flush sensor as described at the outset is shown in FIG. 1. Such a sensor is realised by a plate capacitor in which, for practical reasons, the plates are not positioned opposite one another, but are instead arranged in a plane. This arrangement of the plates is referred to below as the measurement capacitor. FIG. 2 shows a circuit arrangement for measuring at least one such measurement capacitor 11. This circuit arrangement is characterised by an inverting amplifier 10 with a high open-circuit voltage gain, the input 13 of which is connected to a connection of the at least one measurement capacitor 11 and to a connection of a negative feedback capacitor 12, wherein the other connection of the at least one measurement capacitor 11 is connected to a reference potential 14 and the other connection of the negative feedback capacitor 12 is connected to an output 15 of the inverting amplifier 10. Provision is made for a rectifier circuit 16 which is fed the voltage at the output 15 of the inverting amplifier 10 and which generates at its output a voltage 18 corresponding to the voltage at the output 15 of the inverting amplifier 10. Provision is further made for a holding capacitor 17 for buffering the voltage supply of the inverting amplifier 10 and the rectifier circuit 16. The inverting amplifier 10, the negative feedback capacitor 12, the rectifier circuit 16 and the holding capacitor 17 form a circuit part 50 which will be looked at in more detail below. A supply voltage connection of the inverting amplifier 10 is supplied with a periodic control voltage 20 with respect to the reference potential 14 and the other supply voltage connection of the inverting amplifier 10 is supplied via a diode 25 with an external supply voltage 26.

The periodic control voltage 20 is generated by a signal source 22 which has a control input 24 via which the level of the periodic control voltage 20 can be infinitely variably set. This control input 24 is connected to an output 23 of a control device 21 which compares the voltage 18 generated at the output of the rectifier circuit 16 with a desired voltage 19 and, depending on the comparison, emits an output signal fed to the control input 24 of the signal source 22. Depending on this output signal, the periodic control voltage 20 is generated in the signal source 22 and fed to the supply voltage connection of the inverting amplifier. As soon as the control voltage (20) reaches a level at which the voltage 18 generated at the output of the rectifier circuit 16 matches the desired voltage 19, at least the voltage present at the output 23 of the control device 21 is a measure for the measurement capacitor 11.

The key aspect of the circuit arrangement is the inverting amplifier 10 with a highest possible open-circuit voltage gain, if possible more than 100. Such an amplifier can very easily be produced with a two-stage transistor circuit or a standard operation amplifier. The inverting amplifier 10, the negative feedback capacitor 12, the rectifier circuit 16 and the holding capacitor 17 form the circuit part 50. This circuit part 50 fluctuates, as it were, as a whole with the periodic control voltage 20 with respect to the reference potential 14, as described below. In the positive half-wave of the control voltage 20, with a blocked diode 25, the voltage supply is maintained by the holding capacitor 17 here and, in the negative half-wave of the control voltage 20, the voltage supply is provided via the diode 25 through the external supply voltage 26, recharging of the holding capacitor 17 also taking place in this case. The signal source 22 preferably generates a control signal 20 of rectangular curve shape. The amplitude can be adjusted across a wide range via the control input 24. The control device 21 compares the DC voltage 18 freed from the alternating components of the control voltage 20 with the prescribed desired voltage 19 and generates herefrom the voltage present at the output 23 of the control device which may also be referred to as the regulating voltage and through which the amplitude of the control voltage 20 is regulated via the control input 24 of the signal source, until the voltage 18 and the desired voltage 19 are the same value and in this way the output voltage 15 of the amplifier 10 is kept constant over the entire measurement range of the measurement capacitor 11. In this case, at least the regulating voltage at the output 23 is a measure for the capacitance value of the measurement capacitor 11.

Figure 4:
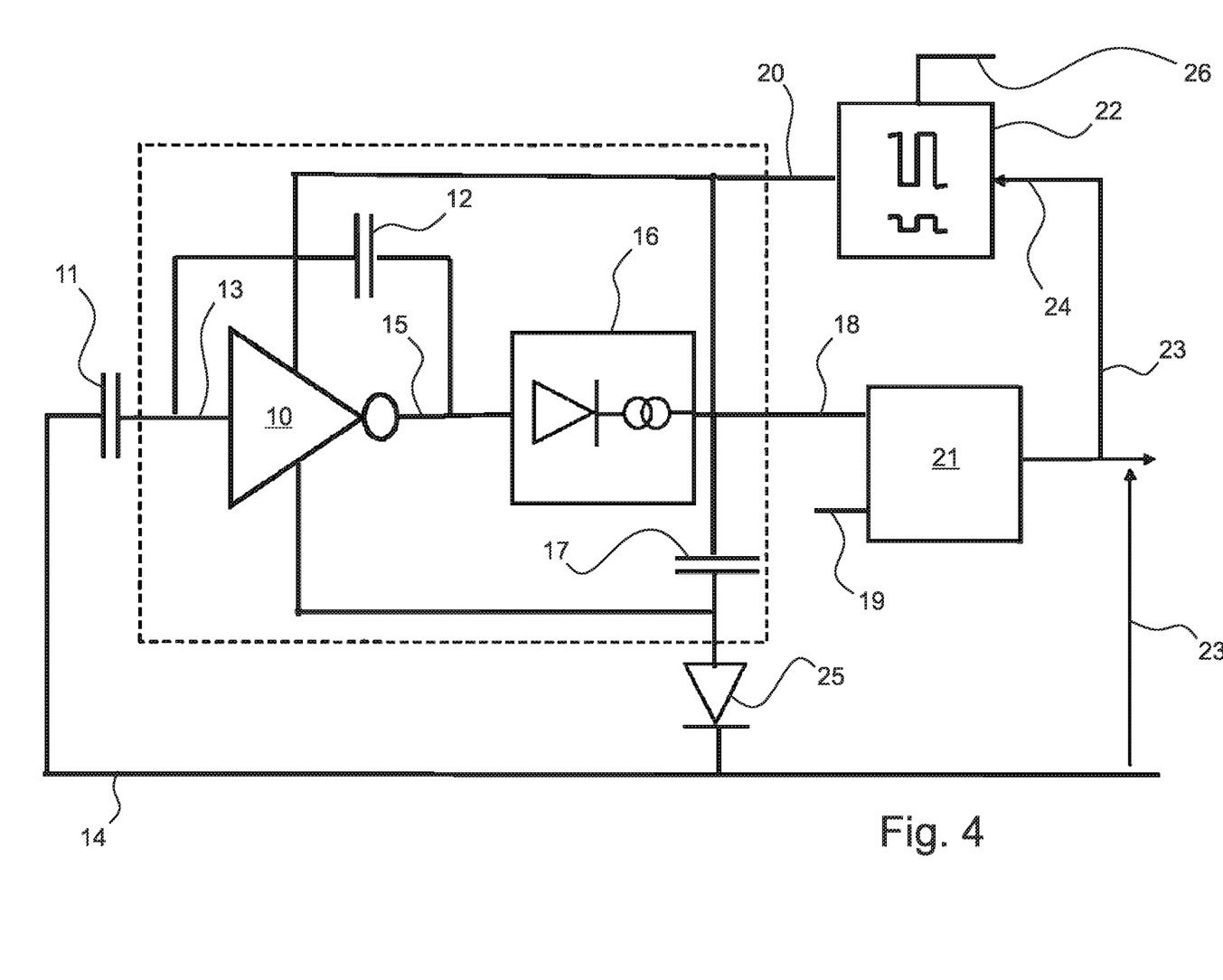
FIG. 4 shows an embodiment of the circuit arrangement according to the invention for measuring at least one measurement capacitor.

FIG. 4 provides an alternative configuration of the circuit arrangement. In FIG. 4, the same elements as in FIG. 2 are given the same reference numerals so reference may be made to the above for a description thereof. However, unlike in FIG. 2, the negative connection (cathode) of the diode 25 is connected to the reference potential 14, while the positive connection (anode) is connected to a supply voltage connection of the inverting amplifier 10. Conversely, the periodic control voltage 20 which generates the signal source 22 is present at the other supply voltage connection of the inverting amplifier 10. In this case, the external supply voltage 26 is fed to the signal source 22.

In this case, in the negative half-wave of the control voltage 20, with a blocked diode 25, the voltage supply is maintained by the holding capacitor 17 here. In the positive half-wave of the control voltage 20, the voltage supply is carried out and at the same time the recharging of the holding capacitor 17 via the diode 25 in respect of the ground reference 14.

Figure 5:
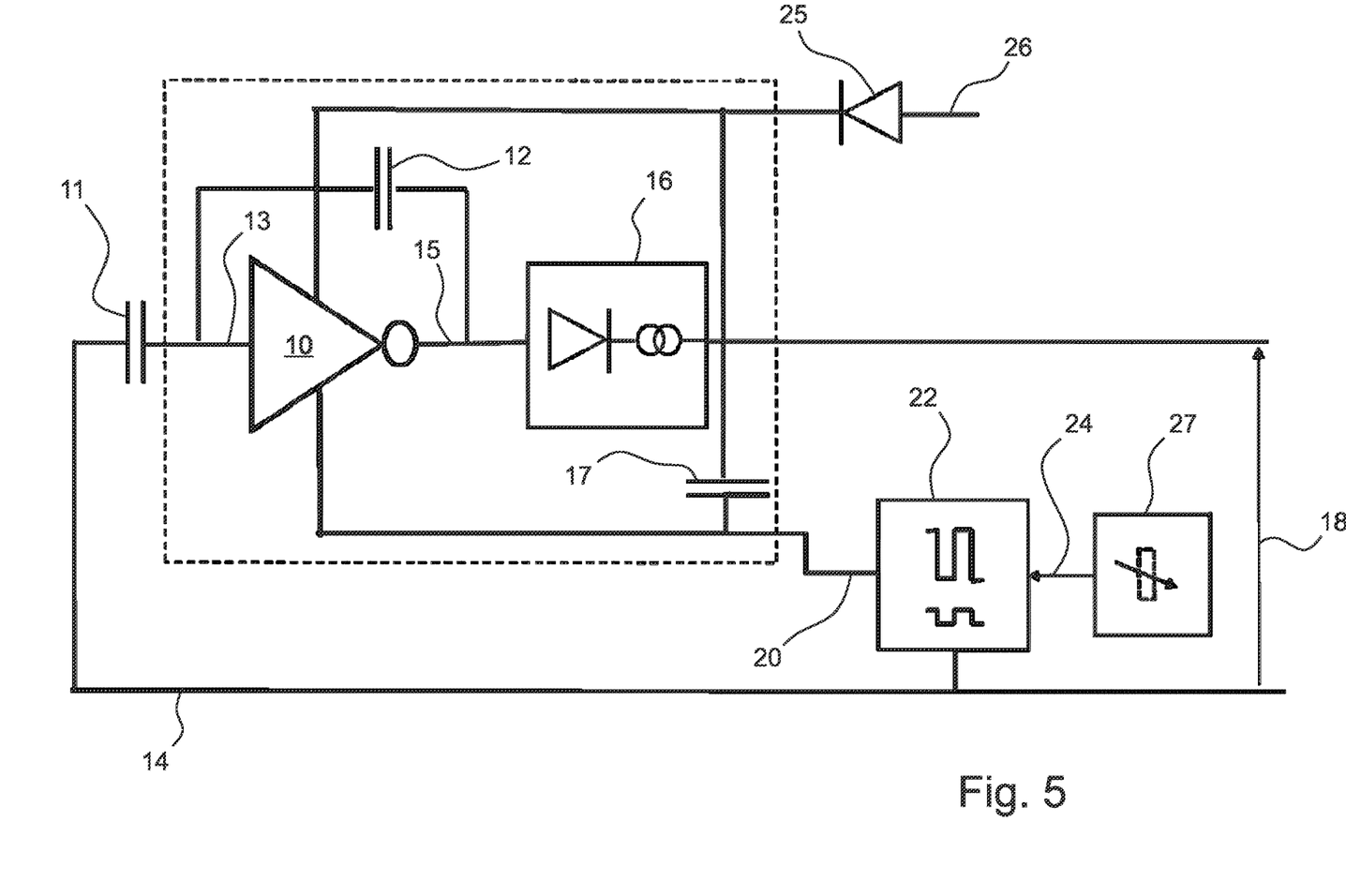
FIG. 5 shows a further embodiment of a circuit arrangement for measuring a measurement capacitor.

FIG. 5 shows an alternative embodiment of the circuit arrangement according to the invention for measuring the at least one measurement capacitor 11. In the latter, the same elements are given the same reference numerals as in the circuit arrangement shown in FIG. 2. Unlike in the circuit arrangement shown in FIG. 2, here, instead of the control device 21, provision is made for a DC voltage actuator 27, the output of which is fed to the control input 24 of the signal source 22, wherein at least the voltage 18 present at the output of the rectifier circuit 16 is a measure for the at least one measurement capacitor.

Figure 6:
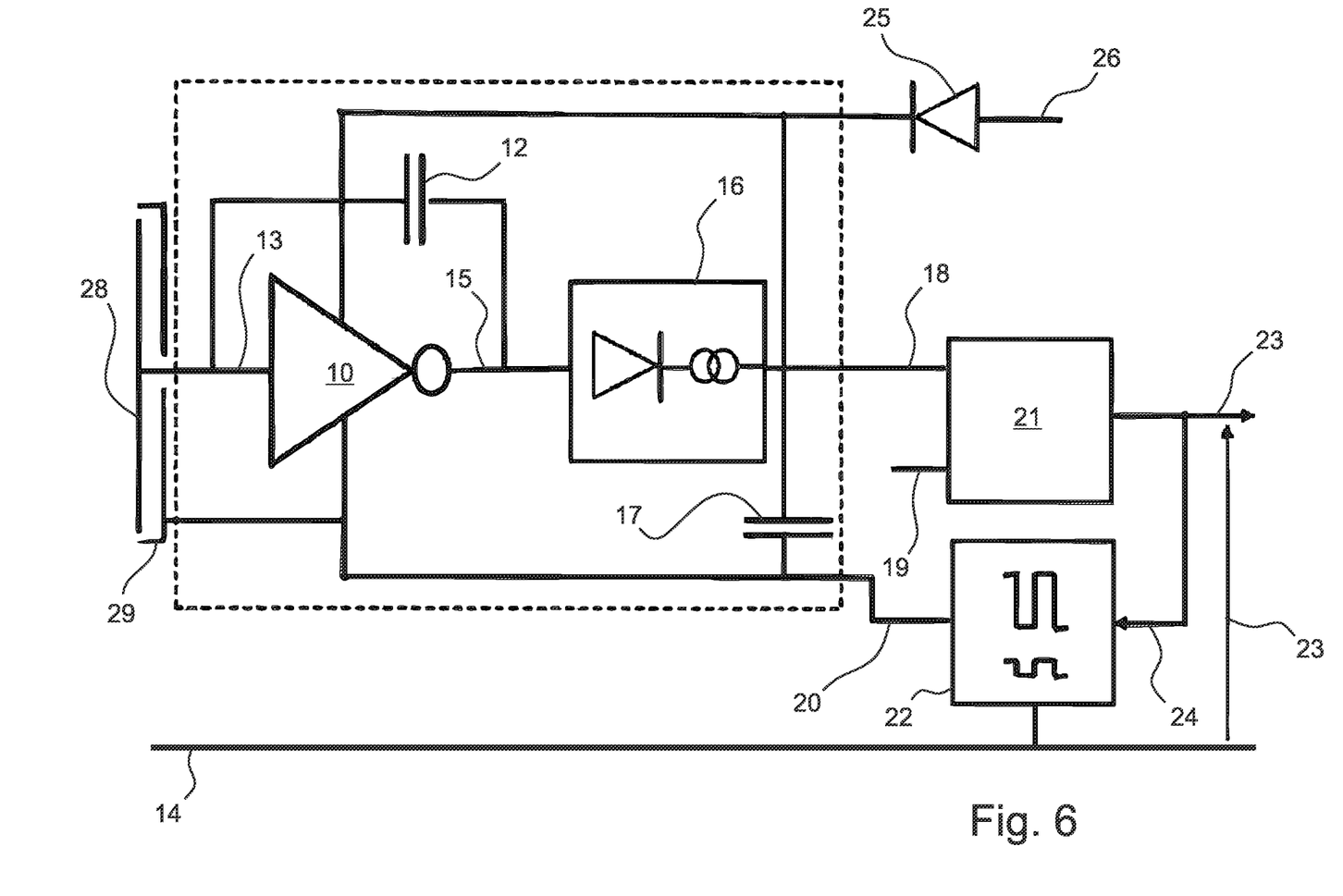
FIG. 6 shows a further embodiment of a circuit arrangement according to the invention for measuring at least one measurement capacitor.

FIG. 6 shows a realisation of the measurement capacitor 11 by an active measuring electrode 28 and at least one shield electrode 29 surrounding the active measuring electrode 28 preferably in a cup-shape. For other applications, this may, for example, also be configured in an annular shape. This shield electrode 29 may also be referred to as a field bundle electrode. The shield electrode or field bundle electrode 29 is supplied with the periodic control voltage 20. The capacitance is measured with respect to the reference potential 14.

In FIG. 6, the same elements are given the same reference numerals as in FIG. 2 and, in this respect, reference is made to the statements in connection with FIG. 2 for a description thereof.

Figure 3:
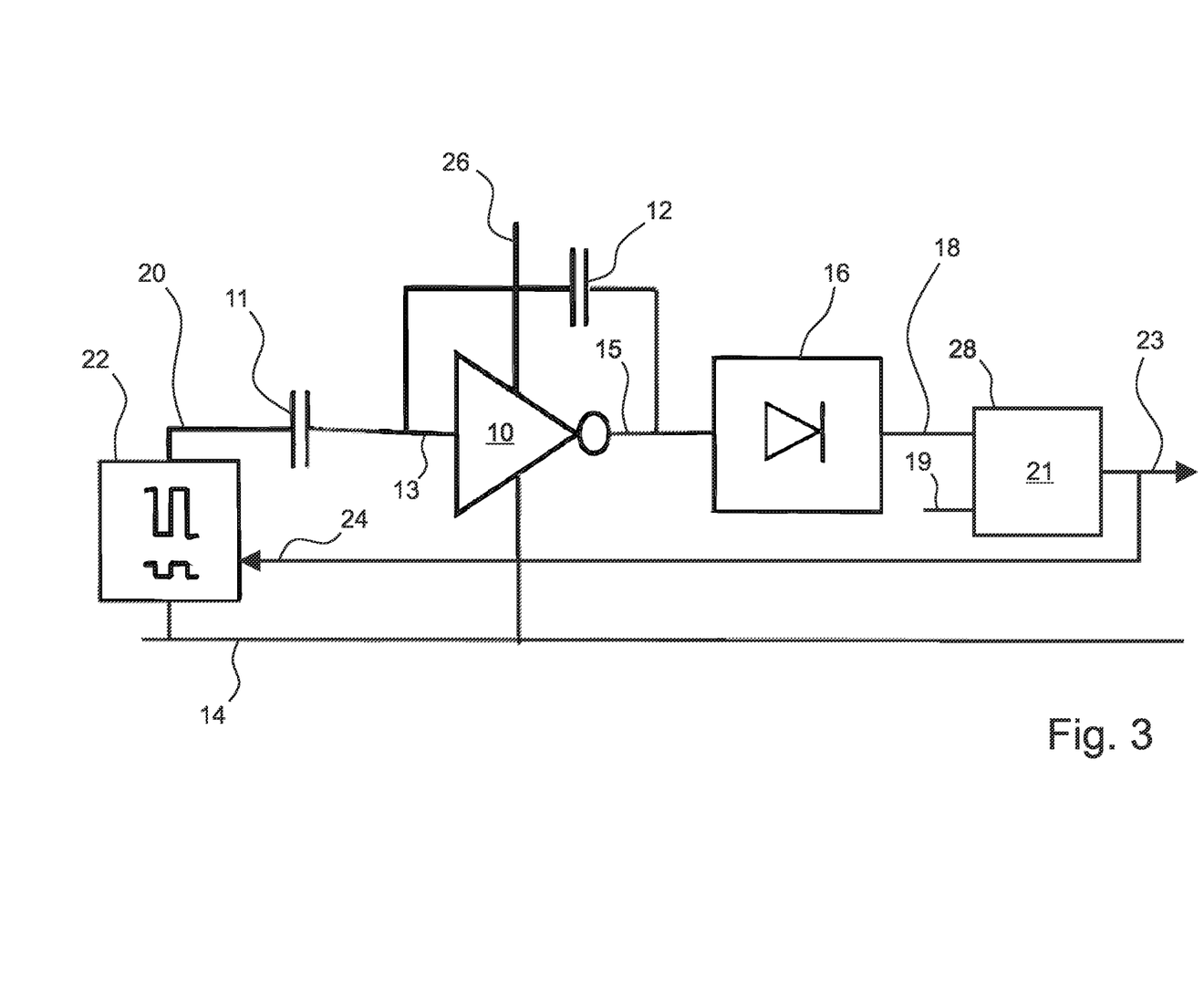
FIG. 3 shows an alternative configuration of a circuit arrangement according to the invention for measuring at least one measurement capacitor.

Another realisation of the circuit arrangement for measuring at least one measurement capacitor 11 is shown in FIG. 3. Here, provision is made for an inverting amplifier 10 with a high open-circuit voltage gain, the input 13 of which is connected to a connection of the at least one measurement capacitor 11 and to a connection of a negative feedback capacitor 12, wherein the other connection of the negative feedback capacitor 12 is connected to an output 15 of the inverting amplifier 10. As in the configurations already described above, provision is also made here for a rectifier circuit 16 which is fed the voltage at the output 15 of the inverting amplifier and which generates at its output a voltage 18 corresponding to the voltage at the output 15 of the inverting amplifier 10. A supply voltage connection of the inverting amplifier 10 is connected to the reference potential 14 and the other supply voltage connection of the inverting amplifier 10 is connected to an external voltage supply 26. A periodic control voltage is generated by a signal source 22, the control input 24 of which is connected to an output 23 of a control device 21 which compares the voltage 18 generated at the output of the rectifier circuit 16 with a desired voltage 19 and, depending on the comparison, emits an output signal 23 fed to the control input 24 of the signal source 22, until the level of the control voltage 20 which is fed to the at least one connection of the measurement capacitor 11 reaches a value at which the voltage 18 generated at the output of the rectifier circuit 16 matches the desired voltage 19. If the voltage 18 present at the output of the rectifier circuit 16 matches the desired voltage 19, at least the voltage present at the output 23 of the control device 21 is a measure for the measurement capacitor 11. The signal source 22 also generates a preferably rectangular signal in this case.

The advantage of the circuits described above lies in the fact that the inverting amplifier 10 always works at the same level over the entire measurement range of the measurement capacitor 11, so the requirements on it are minimised. A further great advantage of the circuits described above is that a large measurement range can be detected for the measurement capacitor.

In the 'regulating voltage at the output (23) through capacitor to be measured' characteristic curve (not shown), changes of very small capacitance values are advantageously spread, while changes of larger capacitance values are advantageously increasingly compressed.

The invention claimed is:

1. A circuit arrangement for measuring at least one measurement capacitor, said circuit arrangement comprising:
    an inverting amplifier with a high open-circuit voltage gain, an input of which is connected to a connection of the at least one measurement capacitor and to a connection of a negative feedback capacitor, wherein the another connection of the at least one measurement capacitor is connected to a reference potential and another connection of the negative feedback capacitor is connected to an output of the inverting amplifier;
    a rectifier circuit which is fed the voltage at the output of the inverting amplifier and which generates at its output a voltage corresponding to the voltage at the output of the inverting amplifier;
    a holding capacitor for buffering the voltage supply of the inverting amplifier and the rectifier circuit,
    wherein a supply voltage connection of the inverting amplifier is supplied with a periodic control voltage with respect to the reference potential and the other supply voltage connection of the inverting amplifier is supplied via a diode with an external supply voltage,
    wherein the periodic control voltage is generated by a signal source which has a control input via which the level of the periodic control voltage is infinitely variably set and wherein this control input is connected to an output of a control device which compares the voltage generated at the output of the rectifier circuit with a desired voltage and, depending on a comparison, emits an output signal fed to the control input of the signal source, until the level of the periodic control voltage which is fed to the supply voltage connection of the inverting amplifier reaches a value at which the voltage generated at the output of the rectifier circuit matches the desired voltage, and
    wherein, if the voltage present at the output of the rectifier circuit matches the desired voltage, at least the voltage present at the output of the control device is a measure for the at least one measurement capacitor.

2. The circuit arrangement according to claim 1, wherein the at least one measurement capacitor is formed by an active measuring electrode and at least one shield electrode or field bundle electrode preferably surrounding the active measuring electrode in a cup-shape, wherein the shield electrode or field bundle electrode is supplied with the periodic control voltage and wherein a capacitor is measured with respect to the reference potential.

3. The circuit arrangement according to claim 1, wherein the inverting amplifier, the negative feedback capacitor (12), the rectifier circuit and the holding capacitor form a circuit part which as a whole fluctuates with the periodic control voltage with respect to the reference potential.

4. The circuit arrangement according to claim 1, wherein a voltage supply of the circuit part takes place, in a positive/negative half-wave of the periodic control voltage, with a blocked diode through the holding capacitor and, in a negative/positive half-wave of the periodic control voltage, with a continuous diode under recharging of the holding capacitor through the external supply voltage with respect to the reference potential.

5. The circuit arrangement according to claim 1, wherein the periodic control voltage is of rectangular shape.

6. The circuit arrangement according to claim 1, wherein, instead of the control device, provision is made for a DC voltage actuator (27), the output of which is fed to the control input of the signal source, wherein at least the voltage present at the output of the rectifier circuit is a measure for the at least one measurement capacitor.

7. A circuit arrangement for measuring at least one measurement capacitor, said circuit arrangement comprising:
- an inverting amplifier with a high open-circuit voltage gain, the input of which is connected to a connection of the at least one measurement capacitor and to a connection of a negative feedback capacitor, wherein another connection of the negative feedback capacitor is connected to an output of the inverting amplifier;
- a rectifier circuit which is fed the voltage at the output of the inverting amplifier and which generates at its output a voltage corresponding to the voltage at the output of the inverting amplifier;
- wherein a supply voltage connection of the inverting amplifier is connected to the reference potential and the other supply voltage connection of the inverting amplifier is connected to an external supply voltage;
- wherein a periodic control voltage is generated by a signal source, a control input of which is connected to an output of a control device which compares the voltage generated at the output of the rectifier circuit with a desired voltage and, depending on a comparison, emits an output signal fed to the control input of the signal source, until a level of the periodic control voltage which is fed to the other connection of the at least one measurement capacitor reaches a value at which the voltage generated at the output of the rectifier circuit matches the desired voltage, and
- wherein, if the voltage present at the output of the rectifier circuit matches the desired voltage, at least the voltage present at the output of the control device is a measure for the at least one measurement capacitor.

8. The circuit arrangement according to claim 7, wherein the periodic control voltage is of rectangular shape.

9. The circuit arrangement according to claim 7, wherein instead of the control device, provision is made for a DC voltage actuator, the output of which is fed to the control input of the signal source, wherein at least the voltage present at the output of the rectifier circuit is a measure for the at least one measurement capacitor.

10. The circuit arrangement according to claim 7, wherein the at least one measurement capacitor is formed by an active measuring electrode and at least one shield electrode or field bundle electrode preferably surrounding the active measuring electrode in a cup-shape, wherein the shield electrode or field bundle electrode is supplied with the periodic control voltage and wherein a capacitor is measured with respect to the reference potential.

* * * * *